United States Patent [19]
Abe

[11] Patent Number: 5,694,369
[45] Date of Patent: Dec. 2, 1997

[54] SEMICONDUCTOR MEMORY DEVICE

[75] Inventor: Kazuhiko Abe, Tokyo, Japan

[73] Assignee: NEC Corporation, Tokyo, Japan

[21] Appl. No.: 790,626

[22] Filed: Jan. 29, 1997

Related U.S. Application Data

[62] Division of Ser. No. 625,555, Apr. 1, 1996.

[30] Foreign Application Priority Data

Mar. 31, 1995 [JP] Japan ................................ 7-075113

[51] Int. Cl.$^6$ ........................................... G11C 7/00
[52] U.S. Cl. .................... 365/210; 365/233.5; 365/203
[58] Field of Search ............................ 365/210, 203, 365/233.5, 207

[56] References Cited

U.S. PATENT DOCUMENTS 5,029,135  7/1991  Okubo ............................... 365/210
5,502,681  3/1996  Park ................................. 365/210

FOREIGN PATENT DOCUMENTS 359884  3/1991  Japan .

Primary Examiner—A. Zarabian

[57] ABSTRACT

A semiconductor memory device is proposed wherein dummy memory cells are provided at the most remote end of each word line with the object of enabling output of correct data despite the large or varying capacity between lines accompanying the trend to large capacity and despite variation in operating times of amplification and other circuits. These dummy memory cells are connected by dummy bit lines having greater line width and narrower line spacing than bit lines. A dummy amplification circuit is provided that is activated by a sense amplification enable signal amplifies data of the dummy bit lines. An internal control signal generation circuit determines the timing of changes in level to the inactive level of the word line enable signal, sense amplification enable signal, and data latch signal according to output signals of the dummy amplification circuit.

5 Claims, 10 Drawing Sheets

1 — MEMORY CELL ARRAY
BL11~BL21 — BIT LINE
DL1,DL2 — DATA LINE
MC11~MC22 — MEMORY CELL
WL1~WLm — WORD LINE

12x — DELAY CIRCUIT

13 — DELAY CIRCUIT
DWL — DUMMY WORD LINE
DMC1, DMC2 — DUMMY MEMORY CELL

12 --- DELAY CIRCUIT
IV1~IV11 --- INVERTER
NAG1~NAG3 --- NAND GATE
T1,T2 --- TRANSISTOR
TG1 --- TRANSFER GATE (j = 1~m)

T11 ~ T14 ··· TRANSISTOR (j = 1~m)

SEMICONDUCTOR MEMORY DEVICE

This is a division of application Ser. No. 08/625,555, filed Apr. 1, 1996 pending.

BACKGROUND OF THE INVENTION

1. Field of the Invention

The present invention relates to a semiconductor memory device, and particularly to a semiconductor memory device provided with means for generating various types of control signals to its interior.

2. Description of the Related Art

In a semiconductor memory device having a construction in which operation of each section is controlled by detecting changes in the address values of address signals and generating to the interior various types of control signals that become active or inactive levels of prescribed interval according to the content of detection, the longer the interval during which address values of address signals change, the smaller the proportion of actual operation time to access cycles, thereby allowing a reduction of current consumption.

FIG. 1 shows a first example of a prior-art semiconductor memory device of the above-described construction having a lengthened interval during which address values of address signals change.

The semiconductor memory device shown in FIG. 1 is made up of memory cell array 1, a plurality of bit line pairs, row address decoder 2, precharge circuit 3x, column address decoder 4, column switch circuit 5, amplification circuit 6, output data latch circuit 7, output buffer circuit 8, address transition detection circuit 10, and internal control signal generation circuit 11x.

Explanation will next be given regarding each of the above-described components. First, memory cell array 1 has a plurality of memory cells (MC11-MCm2, ...) arranged in row and column directions. Each of the plurality of memory cells (MC11-MCm2, ...) has first and second data input/output terminals, and when in a selected state, data in a mutually complementary level relation are inputted and outputted from the first and second data input/output terminals, these data are written and stored, and stored data are read out.

The plurality of bit line pairs are provided corresponding to each row of the above-described memory cells (MC11-MCm2, ...); and are constructed from a plurality of word lines WL1-WLm that place in selected state the correspondingly provided row of memory cells when made the selected level; and first and second bit lines (BL11, BL12, BL21, BL22, ...) provided corresponding to each column of the plurality of memory cells (MC11-MCm2, ...) that connect together first data input/output terminals and second data input/output terminals, respectively, of the memory cells of a corresponding column.

When word line enable signal WLE is at an active level, row address decoder 2 makes a prescribed word line among the plurality of word lines WL1-WLm the selected level in accordance with row address signal ADX.

Precharge circuit 3x precharges the plurality of bit line pairs to a prescribed potential according to the active level of precharge control signal PE* (* indicates that a low level is the active level).

Column address decoder 4 and column switch circuit 5 are provided as a column selection circuit and select a prescribed bit line pair among the plurality of bit line pairs according to column address signal ADY.

Amplification circuit 6 amplifies the data of a bit line pair selected by the above-described column selection circuit composed of column address decoder 4 and column switch circuit 5 to correspond to an active level indicated by sense amplification enable signal SE and outputs the result.

Output data latch circuit 7 latches output data of amplification circuit 6 in accordance with the active level of data latch signal LE and outputs the result.

Output buffer circuit 8 outputs the output data of output data latch circuit 7 to the outside.

Address transition detection circuit 10 inputs an address value of address signal AD including row address signal ADX and column address signal ADY, and outputs address transition detection signal ACD upon detecting a change in this signal.

Internal control signal generation circuit 11x outputs word line enable signal WLE, sense amplification enable signal SE, data latch signal LE, and precharge control signal PE* at prescribed timing and active levels of prescribed interval in accordance with address transition detection signal ACD.

As shown in FIG. 2, each of memory cells (MC11-MCm2, ...) is constructed from a memory section having first and second memory nodes N1 and N2 with transistors T21 and T22 and resistance R21 and R22 configured in flip-flop form, and switching transistors T23 and T24.

Transistors T23 and T24 have gates connected to word line (WLj: j=1-m) and turn ON when word line (WLj: j=1-m) is the selected level (high level), and memory nodes N1 and N2 of the above-described memory section are connected with first and second bit lines (BLk1, BLk2: k=1, 2, ...).

As shown in FIG. 3, internal control signal generation circuit 11x is provided with inverter IV1 that inverts the level of address transition detection signal ACD, delay circuit 12x composed of inverters IV6 to IV10 which ,delay by prescribed intervals the timing at which the output signals of inverter IV1 change from low level to high level or from high level to low level, and a logic circuit composed of NAND gates NAG1 to NAG3 and inverters IV2 to IV5 that generates word line enable signal WLE, sense amplification enable signal SE, data latch signal LE, and precharge control signal PE* from the output signals of delay circuit 12x and the output signals of inverter IV1.

The operation of this semiconductor memory device will next be explained with reference to FIG. 4, which shows a timing chart of the signals of each section.

When the address value shown by address signal AD (constituent bits A0 to An) changes, address transition detection circuit 10 detects the change and outputs address transition detection signal ACD.

Address transition detection signal ACD is outputted to internal control signal generation circuit 11x, and at internal control signal generation circuit 11x, according to address transition detection signal ACD, the level inverted signal from inverter IV1 and the delay signal from delay circuit 12x are synthesized by NAND gates NAG1 to NAG3.

The output signals from each of NAND gates NAG1 to NAG3 are level inverted by inverters IV2 to IV5, each of which has a differing current drive capacity, and are outputted as word line enable signal WLE, sense amplification enable signal SE, precharge control signal PE*, and data latch signal LE at prescribed timing (t11, t12, t13).

Row address decoder 2 selects a prescribed word line by decoding row address signal ADX (A0-Ai), and makes this selected word line the high-level selected level only when word line enable signal WLE enters a high-level active state. In addition, bit lines (BL11, BL12, BL21, BL22, ...) are precharged in advance to a power-supply potential Vcc level in response to change of precharge control signal PE* to active level (low level). In other words, the precharging transistors of precharge circuit 3x are in an ON state during the time that all word lines are at the low-level unselected level, and all bit line pairs are precharged. On the other hand, when a prescribed word line is at a selected level, the precharging transistors turn OFF and all bit line pairs enter a state in which electric charge for precharging is not supplied.

As described hereinabove, a prescribed word line enters a selected level state, precharge circuit 3x enters an inactive state, and the data of a selected memory cell is outputted to a bit line pair. If a memory cell is connected to the memory node of a memory cell holding high-level data, the bit line maintains a high-level state, but if a memory cell is connected to a memory node holding low-level data, the bit line becomes low level.

If memory node N1 holds high-level data and memory node N2 holds low-level data, the bit line connected to memory node N1, for example if BL11, remains high-level without change, but the bit line connected to memory node N2, for example BL12, discharges to a ground potential point by way of transistors T22 and T24 and becomes low level.

Subsequently, when a prescribed word line changes from high level to low level, low-level bit line BL12 is again precharged to high level (t15).

On the other hand, a bit line pair, for example BL11 and BL12, corresponding to the address designated by column address signal ADY is selected by column address decoder 4 and column switch circuit 5 and connected to amplification circuit 6 by way of data lines DL1 and DL2.

Here, when sense amplification enable signal SE becomes a high-level active level (t12), amplification circuit 6 is activated and data read to the connected bit line pair are amplified and transferred to output data latch circuit 7. Output data Sout of amplification circuit 6 become high level or low level depending on the level of data read to the first and second bit lines of the selected bit line pair.

Output data latch circuit 7 latches output data Sout of amplification circuit 6 during the interval of the active level (high level) of data latch signal LE, and holds these data during the inactive level. The data are then outputted (Dout) to the outside by way of output buffer circuit 8.

At a prescribed timing (t15), word line enable signal WLE and sense amplification enable signal SE become the inactive level and precharge control signal PE* becomes the active level, whereby reading of data from memory cells is ended, and in addition, data latch signal LE becomes the inactive level (t16).

The time from the change of one address value of address signal AD to the change of the next address vale (from t10 to t17) is one read-out cycle, but because the duration of the active level of word line enable signal WLE, sense amplification enable signal SE, and data latch signal LE and the duration of the inactive level of precharge control signal PE* are fixed, the average current consumption decreases as the duration of this read-out cycle lengthens.

However, with the miniaturization accompanying the trend toward large capacities in semiconductor memory devices, there is an increase in the proportion of capacity between bit lines for the first and second bit lines of the bit line pair that transfers read data from a memory cell to amplification circuit 6. Bit lines are principally made from aluminum, and disparities in line width can occur due to variations in manufacture, some lines being thick and other thin. In other words, spacing between bit lines shrinks in proportion to the thickening of bit lines, and the capacity between bit lines increases.

As capacity between bit lines increases, the electric charge of bit lines precharged to high level during a read-out operation is discharged to the ground potential points of memory nodes of memory cells holding low-level data, thereby causing potential differences in bit line pairs. If capacity between bit lines increases as described hereinabove, the time constant accompanying low-level discharge increases and sense amplification enable signal SE changes from low level to high level, thereby causing a decrease in the potential difference between the bit line pair and data line pair inputted to amplification circuit 6 when amplification circuit 6 is activated. In such a case, amplification circuit 6 may easily malfunction.

Specifically, the above-described malfunction involves amplification of reverse data, i.e., incorrect data, when the potential difference of input signals to amplification circuit 6 is insufficient, amplification of correct data beginning at the point at which the potential difference of input data to amplification circuit 6 becomes sufficient. However, the time at which sense amplification enable signal SE changes from high level to low level (t15) is determined regardless of this malfunction. As a result, the inputted potential difference to amplification circuit 6 from a bit line pair and data line pair is small, and consequently, sense amplification enable signal SE becomes low level at the timing at which the output of correct data commences from the amplification circuit, which was malfunctioning at first, and data latch circuit 7 cannot be caused to latch correct data. In other words, there is the danger that the timing at which amplification circuit 6 begins outputting correct data is delayed and output of correct data from this amplification circuit 6 and data latch circuit 7 prevented (the broken line portion in FIG. 4).

Although of differing circuit structure, a semiconductor memory device in which delayed operation by the amplification circuit is avoided through the generation of a sense amplification enable signal according to signals of a dummy decoder and dummy word line is disclosed in, for example, Japanese Patent Laid-open 59884/91.

One example of this type of semiconductor memory device (the second example) is shown in FIG. 5. This semiconductor memory device provides: one row of dummy memory cells (DMC1, DMC2, ...) of the same construction as memory cell MC11 in a state of disconnection with bit lines corresponding to data input/output terminals; dummy word line DWL connected to the gates of the switching transistors of each of these dummy memory cells; dummy decoder 14 that makes this dummy word line DWL the selected level when precharge control signal PEy is the inactive level; and delay circuit 13 that delays the signal of dummy word line DWL; and when precharge control signal PEy is at the inactive level, both makes one word line designated by row address signal ADX the selected level using row address decoder 2y and makes dummy word line DWL the selected level using dummy decoder 14, and using delay circuit 13, delays the signal of the selected level of this dummy word line DWL and makes it sense amplification enable signal SEy of amplification circuit 6y.

In the semiconductor memory device shown in FIG. 5, a transistor that detects change of at least one line to the selected level among the plurality of word lines WL1 to WLm and that makes sense amplification enable signal SEy the active level is connected to the signal transfer line of this sense amplification enable signal SEy.

The semiconductor memory device shown in FIG. 5 was developed as a solution to the problems that, with the trend toward large capacity the number of word lines increases, the parasitic capacity of these signal transfer lines becomes large, transfer of sense amplification enable signal SEy to amplification circuit 6y is delayed, and the amplification operation is also delayed. The above-described construction can provide a solution to this problem because a transistor for detecting word line selected level need not be connected to the above-described signal transfer lines.

Of the above-described semiconductor memory devices of the prior art, the prior-art example shown in FIG. 4 is of a structure in which the time intervals during which word line enable signal WLE, sense amplification enable signal SE, data latch signal LE, and precharge control signal PE* become high level (active level for WLE, SE, and LE and inactive level for PE*) are fixed to set times, and consequently, the danger arises that increase in capacity between bit lines as the spacing between bit lines narrows with the trend toward large capacity, and variations in capacity between bit lines resulting from discrepancies in bit line width and bit line spacing due to irregularities in manufacturing, will result in delays in amplification by amplification circuit 6 and variations in the operating time of this circuit, and as a consequence, sense amplification enable signal SE may become the inactive level without any correct data being outputted from amplification circuit 6, the duration of active level of data latch signal LE may near its end just as correct data are outputted from amplification circuit 6, preventing correct data from being latched in data latch circuit 7; and correct data cannot be outputted.

In the prior-art example shown in FIG. 5, the amount of delay of sense amplification enable signal SEy for the selected level of a word line can be compensated, but compensation cannot be effected for the variation and delay in operation of a circuit including memory cells (MC11, etc.), bit lines (BL11, etc.) and amplification circuit 6y, and consequently, there is the danger that, as in the first example, correct data will not be outputted.

SUMMARY OF THE INVENTION

The object of the present invention is to provide a semiconductor memory device that allows output of correct data despite variation in the operating time of circuits of each section including memory cells and amplification circuit, and despite variation in capacity between bit lines resulting from the manufacturing irregularities and the increase in capacity between bit lines accompanying the trend toward large capacities.

According to the present invention, a semiconductor memory device that includes an internal control signal generation circuit that detects change in address input and generates internal signals further includes:

an amplification circuit that amplifies the data of normal bit lines;

a dummy amplification circuit that amplifies the data of dummy bit lines; and a delay element that delays timing at which the data of the dummy bit lines are inputted to the dummy amplification circuit relative to timing at which data of the normal bit lines are inputted to the amplification circuit;

the dummy amplification circuit being characterized by changing the states of signals generated at the internal control signal generation circuit.

In this case, the amplification circuit and dummy amplification circuit may be activated by signals generated by the internal control signal generation circuit, and the amplification circuit may be made inactive by a signal generated by the internal control signal generation circuit in response to changes in output of the dummy amplification circuit.

In addition, the semiconductor memory device is characterized by including:

a memory cell array having first and second data input/output terminals and a plurality of memory cells arranged in a row direction and column direction in which, during a selected state, data in a mutually complementary level relation are written from the first and second data input/output terminals and stored, and stored data are read out;

a plurality of word lines provided corresponding to each row of the plurality of memory cells which, when at a selected level, place a corresponding row of memory cells in a selected state;

a plurality of bit line pairs provided corresponding to each column of the plurality of memory cells made up of first bit lines that connect first data input/output terminals and second bit lines that connect second data input/output terminals of corresponding columns of memory cells;

a row address decoder that places at the selected level a prescribed word line among the plurality of word lines in accordance with row address signals when a word line enable signal is at an active level;

a plurality of dummy memory cells provided at the end of each of the plurality of word lines most remote from the row address decoder, which have first and second data output terminals, which store data that are of fixed levels and in a mutually complementary level relation and, when in a selected state, which read these data from the first and second data output terminals;

a dummy bit line pair made up of a first dummy bit line that connects to first data output terminals and a second dummy bit line that connects to second data output terminals of the plurality of dummy memory cells;

a precharge circuit that precharges the plurality of bit line pairs and dummy bit line pair to a prescribed potential in response to an active level of a precharge control signal;

a column selection circuit that selects a prescribed bit line pair among the plurality of bit line pairs in accordance with a column address signal;

an amplification circuit that amplifies and outputs the data of a bit line pair selected by the column selection circuit in response to an active level of a sense amplification enable signal;

an output data latch circuit that latches and outputs output data of the amplification circuit in response to an active level of a data latch signal;

a dummy amplification circuit that amplifies data of the dummy bit line pair in response to an active level of the sense amplification enable signal, and outputs the result as data of a level differing from the precharge potential of the dummy bit line pair;

dummy amplification output precharge means that, before the sense amplification enable signal changes to the active level, precharges the output terminal of the dummy amplification circuit to a level corresponding to the precharge potential of the dummy bit line pair;

dummy amplification output delay means that delays the data output timing of the dummy amplification circuit a prescribed time interval from the data output timing of the amplification circuit;

an address transition detection circuit that detects change in an address value of an address signal including the row address signal and column address signal and outputs an address transition detection signal;

an internal control signal generation circuit that determines the timing of level change to the active level of the word line enable signal, sense amplification enable signal, and data latch signal as well as the timing of level change to the inactive level of the precharge control signal in response to the address transition detection signal, determines the timing of level change to the inactive level of the word line enable signal, sense amplification enable signal, and data latch signal as well as the timing of level change to the active level of the precharge control signal in response to the timing of level change of output data of the dummy amplification circuit, and outputs the word line enable signal, sense amplification enable signal, data latch signal, and precharge control signal.

In this case, the internal control signal generation circuit may be composed from:

a transistor that transfers address transition detection signals;

a transfer gate that transfers output data of the dummy amplification circuit when sense amplification enable signal is at active level;

a delay circuit that delays by prescribed delay times each of the leading edge and trailing edge of a signal transferred by the transistor and the transfer gate; and logic circuit that generates a word line enable signal, data latch signal, and precharge control signal in addition to the sense amplification enable signal from the output signal of the delay circuit and the address transition detection signal.

In addition, the dummy amplification output precharge means may also be arranged as a circuit provided with a transistor that places the output terminal of the dummy amplification circuit at a level corresponding to the precharge potential of the dummy bit line pair in accordance with an address transition detection signal.

Further, the dummy amplification delay means may have a construction wherein the spacing between the first and second dummy bit lines of the dummy bit line pair may be made narrower than the spacing between the first and second bit lines of the bit line pairs, the line width of the dummy bit lines may be made wider than the line width of the bit lines, and the parasitic capacity between lines of the dummy bit lines may be made greater than the parasitic capacity between lines of the bit lines.

Furthermore, the line width and line spacing of the first and second dummy bit lines of the dummy bit line pair may be the same as the line width and line spacing, respectively, of the first and second bit lines of bit line pairs;

the memory cells may be circuits provided with memory sections having first and second memory nodes, and first and second switching transistors that turn ON when the word line connected to the respective gate is a selected level, and that connect first memory nodes to the first bit lines and second memory nodes to the second bit lines; and the dummy memory cells and dummy amplification output delay means may be circuits provided with a dummy memory sections that have first And second memory nodes and that store prescribed fixed data; and third and fourth switching transistors having current drive capacity smaller than that of the first and second switching transistors, which turn ON when a word line connected to a respective gate is the selected level, and which connect first memory nodes of the dummy memory section to the first dummy bit line and second memory nodes of the dummy memory section to the second dummy bit line.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Embodiments of the present invention will next be explained with reference to the accompanying figures.

Figure 6:
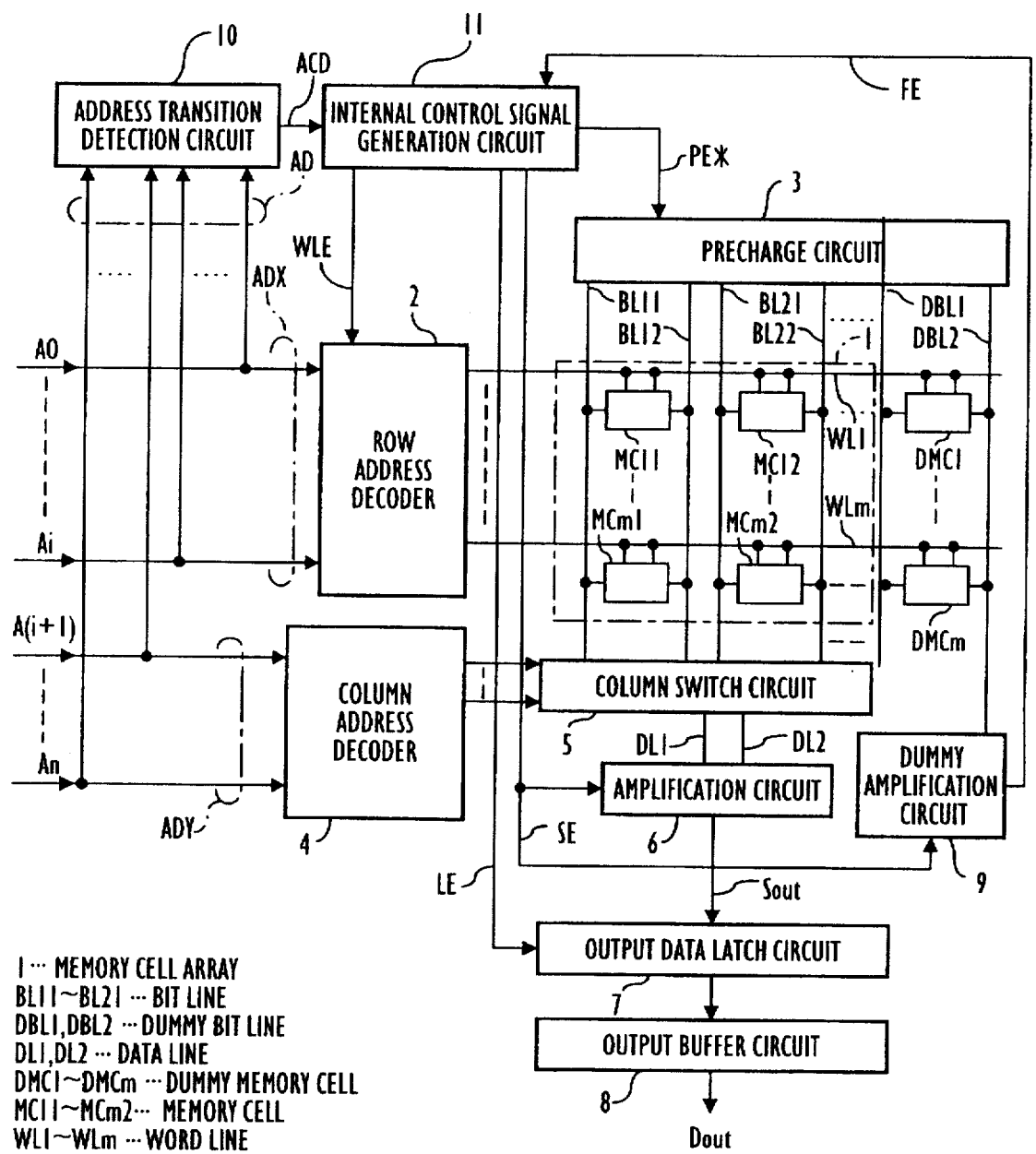
FIG. 6 is a block diagram showing the first embodiment of the present invention.

FIG. 6 is a block diagram showing the construction of a first embodiment of the present invention.

Figure 1:
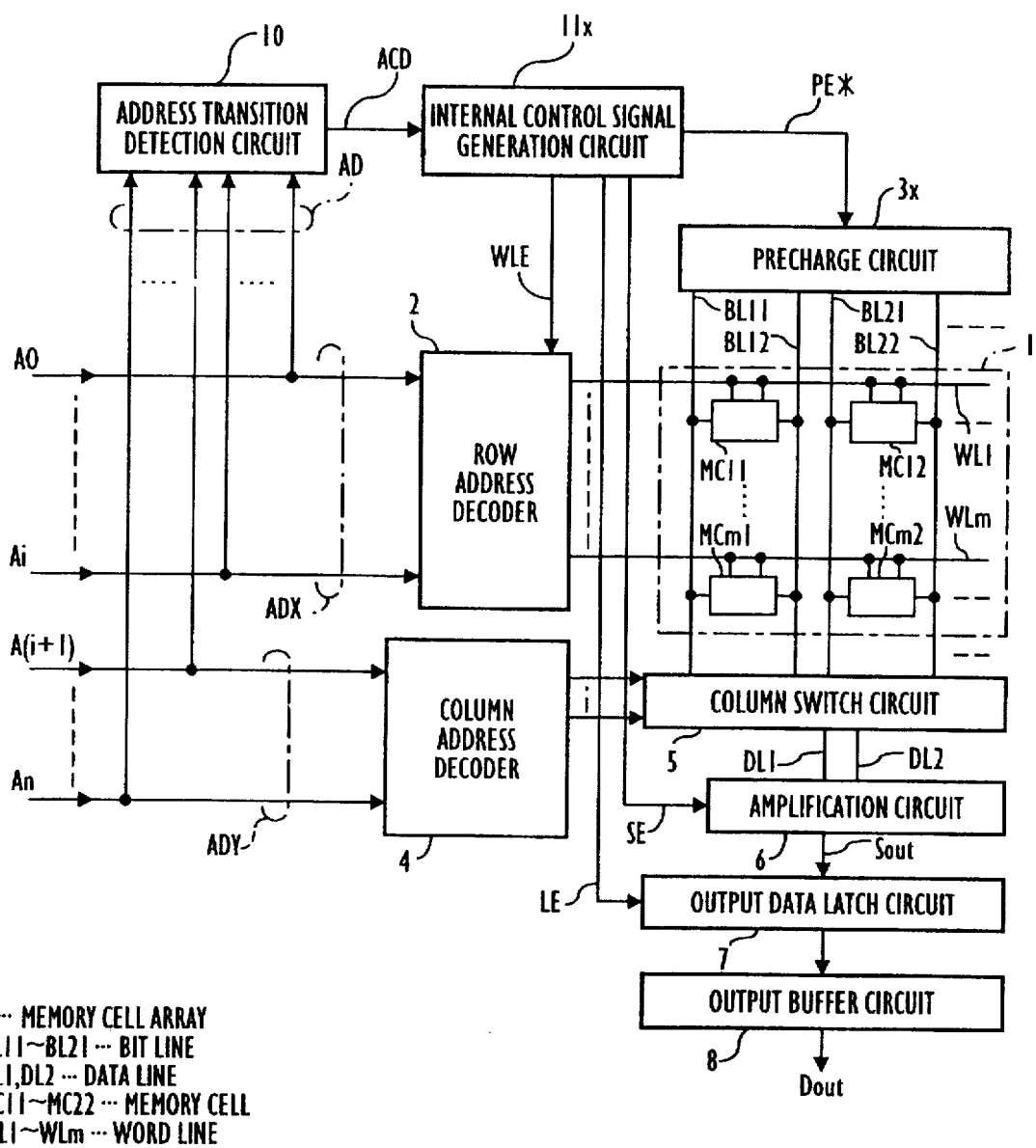
FIG. 1 is a block diagram showing a first example of a semiconductor memory device of the prior art.
Figure 2:
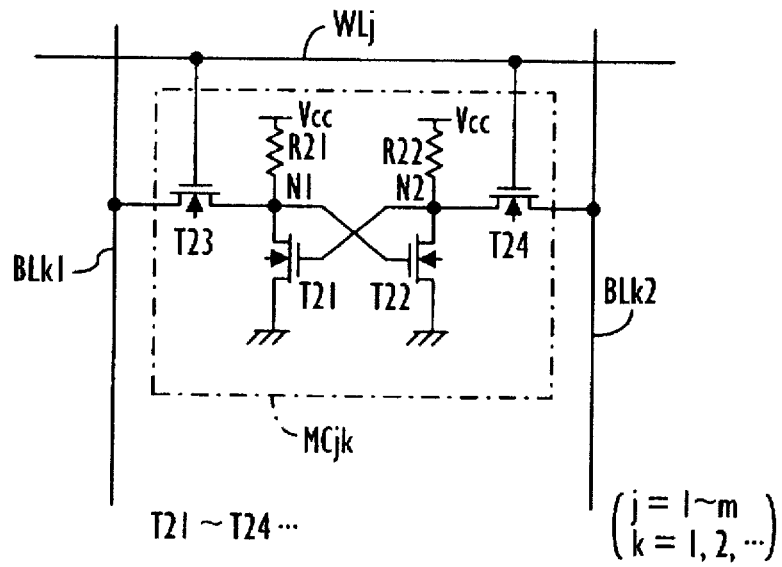
FIG. 2 is a circuit diagram showing a memory cell of the semiconductor memory device of FIG. 1.
Figure 3:
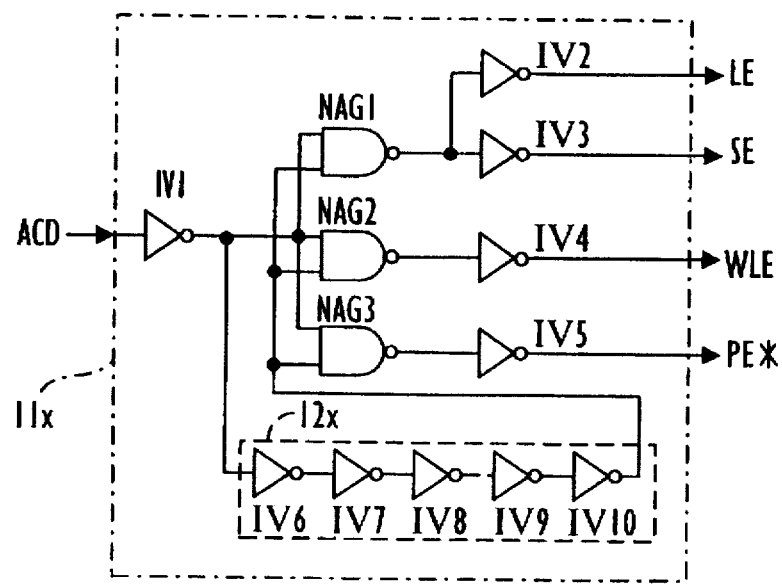
FIG. 3 is a circuit diagram showing the internal control signal generation circuit portion of the semiconductor memory device shown in FIG. 1.
Figure 4:
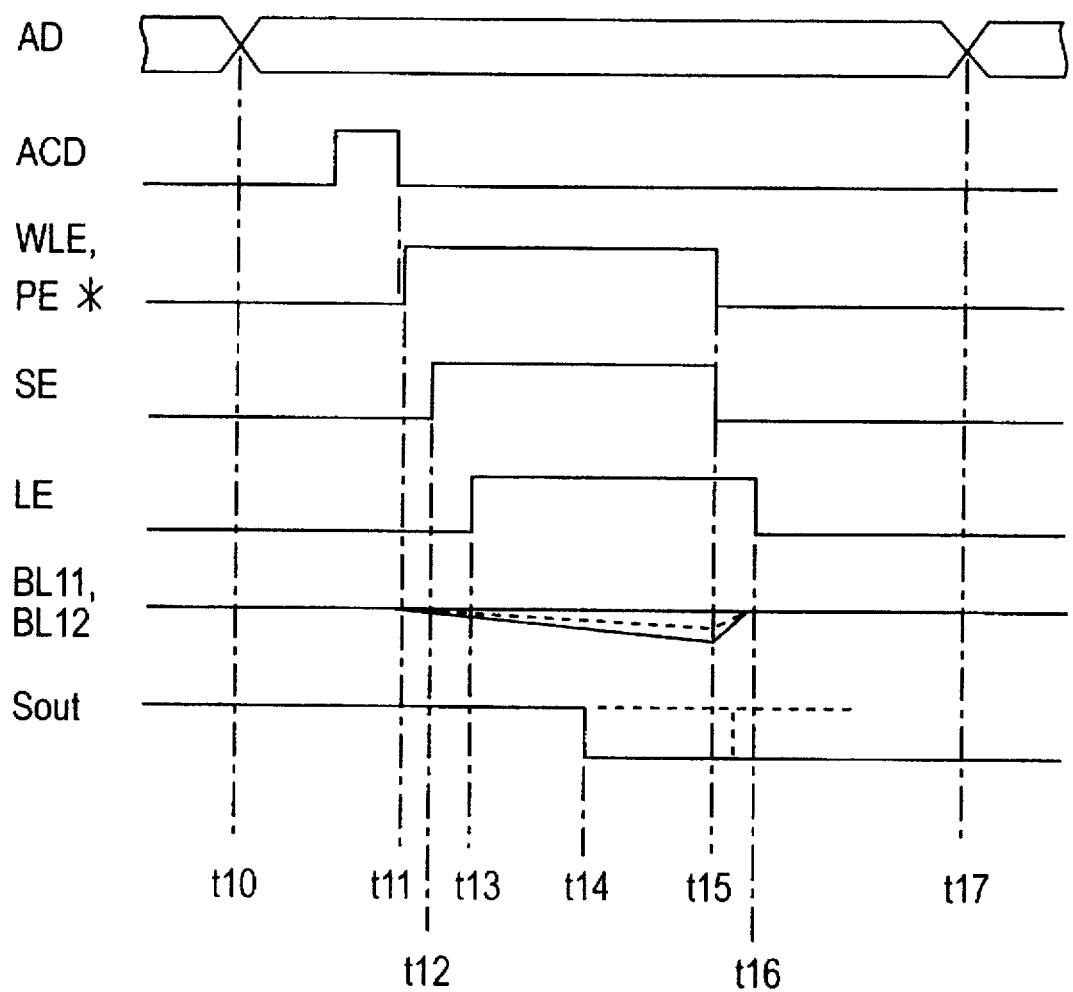
FIG. 4 is a timing wave form chart of the signals of each section to illustrate the operation of the semiconductor memory device shown in FIG. 1.
Figure 5:
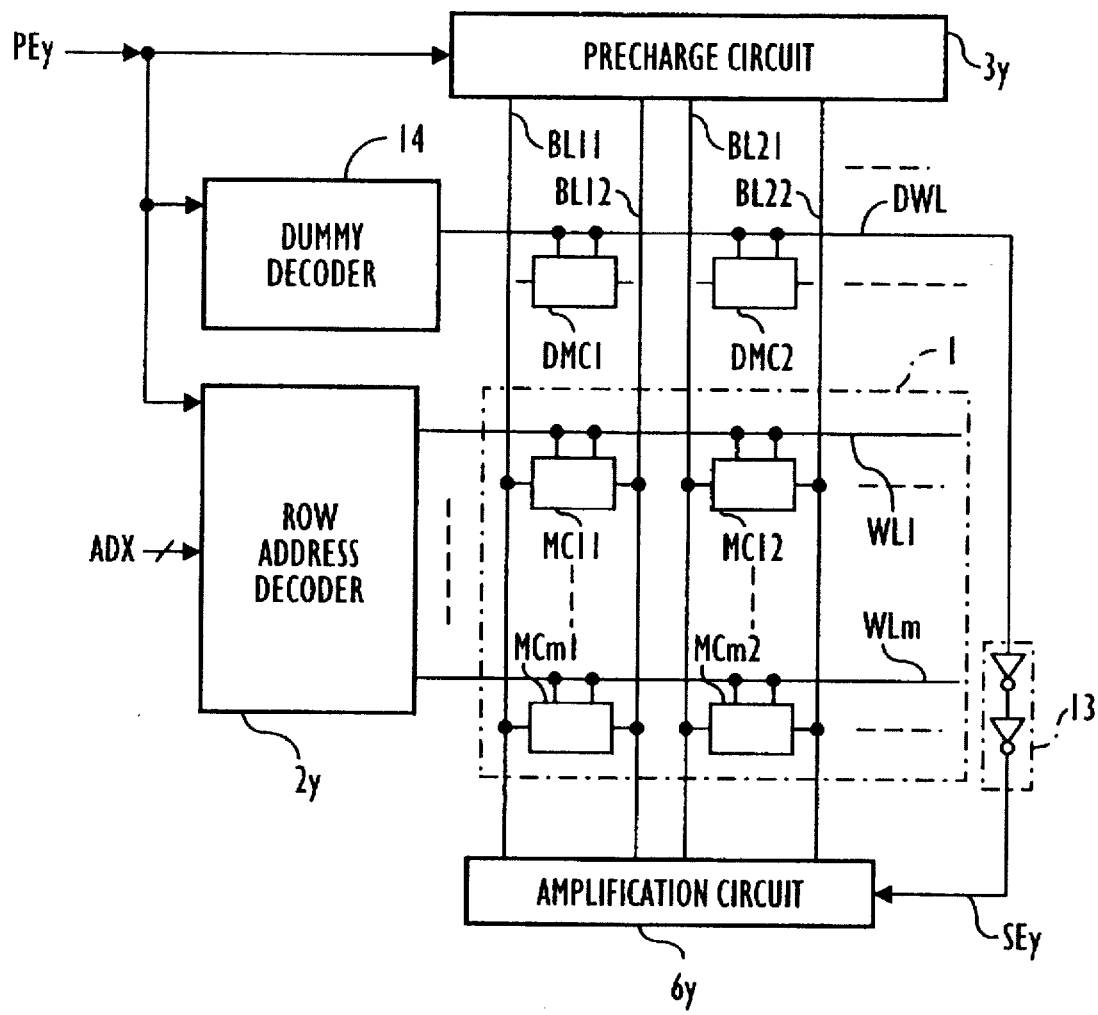
FIG. 5 is a block diagram showing a second example of a semiconductor memory device of the prior art.

This embodiment is distinguished from the semiconductor memory device of the prior art shown in FIG. 1 in that: a plurality of dummy memory cells DMC1 to DMCm and dummy amplification circuit 9 are provided; precharge circuit 3x is made precharge circuit 3; internal control signal generation circuit 11x is made internal control signal generation circuit 11; the spacing of the first and second dummy bit lines DBL1 and DBL2 of the dummy bit line pair is made narrower than the spacing of the first and second bit lines (BL11, BL12, etc.) of the bit line pairs, and moreover, the line width of these dummy bit lines DBL1 and DBL2 is made wider than the line width of the bit lines (BL11, BL12, etc.), thus making the parasitic capacity between lines of the dummy bit lines greater than the parasitic capacity between lines of the bit lines; and a dummy amplification output delay means is provided that delays by a prescribed delay time the timing of level change of output data FE of dummy amplification circuit 9 with respect to the timing of level change of the output data of amplification circuit 6.

The plurality of dummy memory cells DMC1 to DMCm are provided for each of the plurality of word lines WL1 to WLm at the end most remote from row address decoder 2, are provided with first and second data output terminals, and store data of fixed levels that are in a mutually complementary level relationship, and these stored data are read out from the first and second data output terminals when dummy memory cells DMC1 to DMCm are in a selected state.

Dummy amplification circuit 9 is connected to a dummy bit line pair made up of a first dummy bit line DBL1 connected to first data output terminals and a second dummy bit line DBL2 connected to second data output terminals of the above-described plurality of dummy memory cells DMC1 to DMCm, and in response to the active level of sense amplification enable signal SE, the data of this dummy bit line pair are outputted as data of a level differing from the precharge potential of this dummy bit line pair.

Compared to precharge circuit 3x, precharge circuit 3 not only precharges the bit line pairs but has the additional function of precharging the dummy bit line pair.

Compared to internal control signal generation circuit 11x, internal control signal generation circuit 11 not only determines the timing of level change to the active level of word line enable signal WLE, sense amplification enable signal SE, and data latch signal LE, as well as the timing of level change to the inactive level of precharge control signal PE* in response to address transition detection signal; determines the timing of level change to the inactive level of word line enable signal WLE, sense amplification enable signal SE, and data latch signal LE, as well as the timing of level change to the active level of precharge control signal PE* in response to the timing of level change of the output data of dummy amplification circuit 9; and outputs these signals (WLE, SE, LE, PE*); but also is provided with dummy amplification output precharge means that precharges the level of output terminal (output data FE) of dummy amplification circuit 9 to a level corresponding with the precharge level of the dummy bit line pair before sense amplification enable signal SE changes to the active level.

Figure 7:
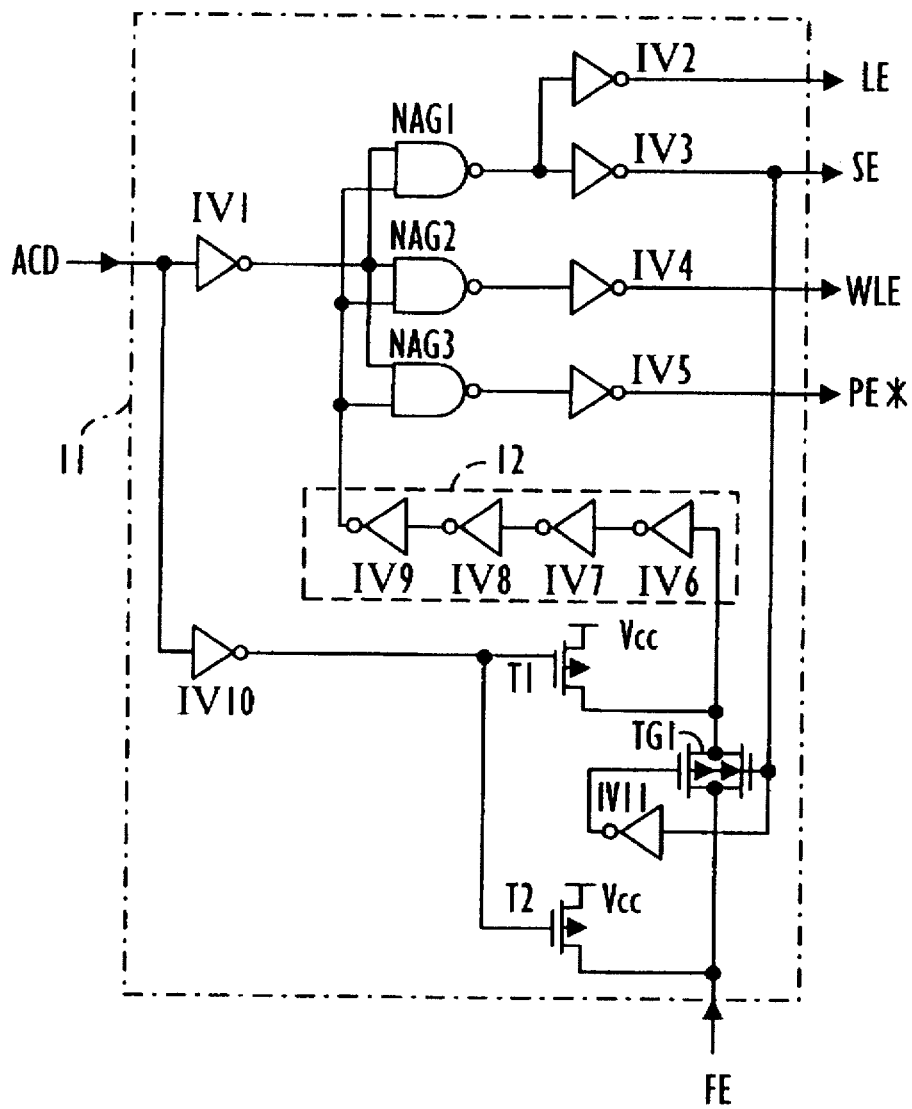
FIG. 7 is a circuit diagram showing the internal control signal generation circuit portion of the embodiment shown in FIG. 6.
Figure 8A:
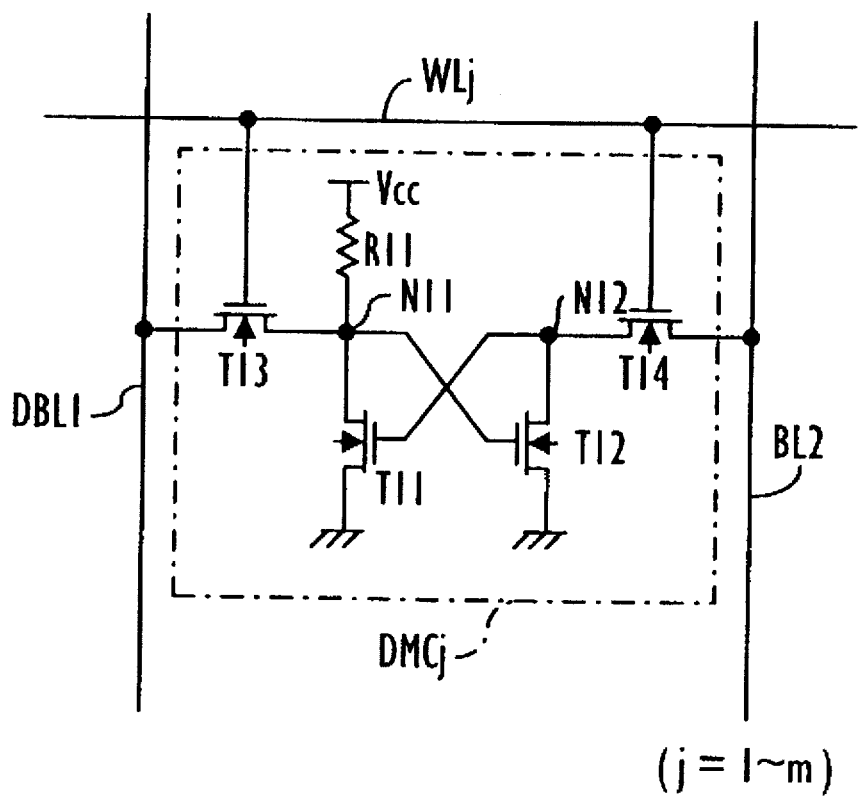
FIG. 8(a) is a circuit diagram showing the dummy memory of the embodiment shown in FIG. 6.
Figure 8B:
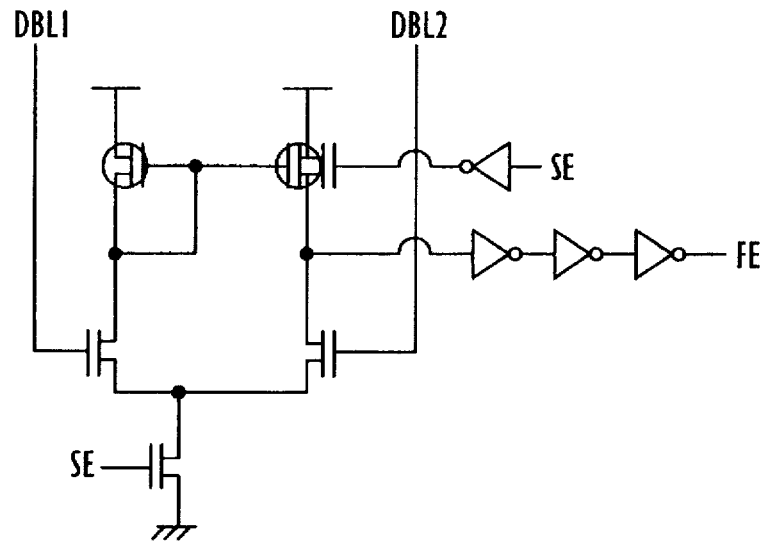
FIG. 8(b) is a circuit diagram showing dummy amplification circuit 9.
Figure 8C:
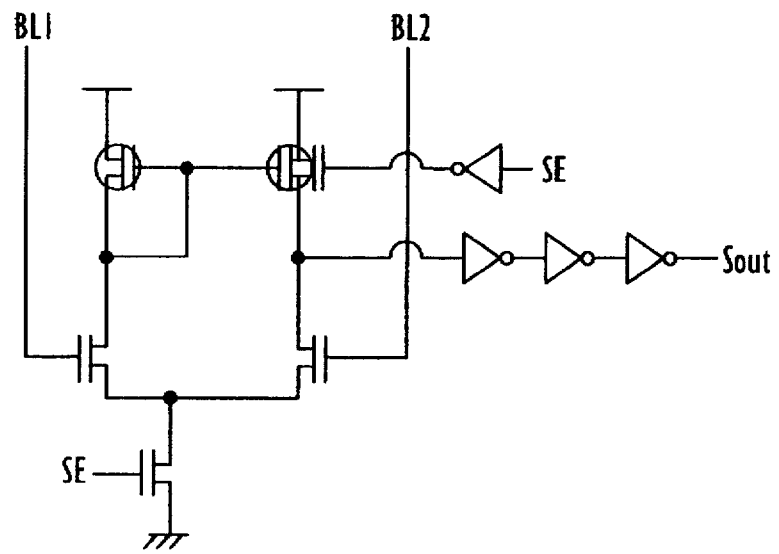
FIG. 8(c) is a circuit diagram showing amplification circuit 6.

FIG. 7 is a circuit diagram showing internal control signal generation circuit 11 of the present embodiment, and FIGS. 8(a), 8(b), and 8(c) are circuit diagrams showing dummy memory cell DMCj (j=1 to m), dummy amplification circuit 9, and amplification circuit 6, respectively.

As shown in FIG. 7, internal control signal generation circuit 11 is made up of:

P-channel transistor T1 that receives at its gate address transition detection signal ACD by way of inverter IV10, receives at its source power-supply potential Vcc, and transfers this address transition detection signal ACD to its drain;

transfer gate TG1 that transfers output signal FE of dummy amplification circuit 9 to an output terminal when sense amplification enable signal SE is the active level;

delay circuit 12 that includes inverters IV6 to IV9 and delays each of the leading edge and trailing edge of a signal transferred to the drain of transistor T1 and the output terminal of transfer gate TG1 by respective prescribed delay times;

NAND gates NAG1 to NAG3 and inverters IV2 to IV5 that generate word line enable signal WLE, sense amplification enable signal SE, data latch signal LE, and precharge control signal PE* from the address transition detection signal inputted by way of inverter IV1 and the output signal of delay circuit 12; and P-channel transistor T2 of dummy amplification output precharge means that receives address transition detection signal ACD by way of inverter IV10 at its gate, receives power-supply potential Vcc at its source, and has its drain connected to the output terminal of dummy amplification circuit 9, i.e., the signal transfer line of its output signal FE, and precharges this signal transfer line to a level (Vcc) corresponding to the precharge potential of the dummy bit line pair in response to address transition detection signal ACD.

As shown in FIG. 8(a), dummy memory cell DMCj is constructed as a circuit equivalent to a circuit memory cell MCjk in which resistance R22 is not connected on the second bit line BLk2 side, and which, when in a selected state, always reads data of a high level to first dummy bit line DBL1 and data of a low level to second dummy bit line DBL2.

In addition, as shown in each of FIG. 8(b) and FIG. ((c), the inputs of dummy amplification circuit 9 and amplification circuit 6, which perform differential amplification, are dummy bit lines DBL1 and DBL2 and bit lines BL1 and BL2, respectively.

Figure 9:
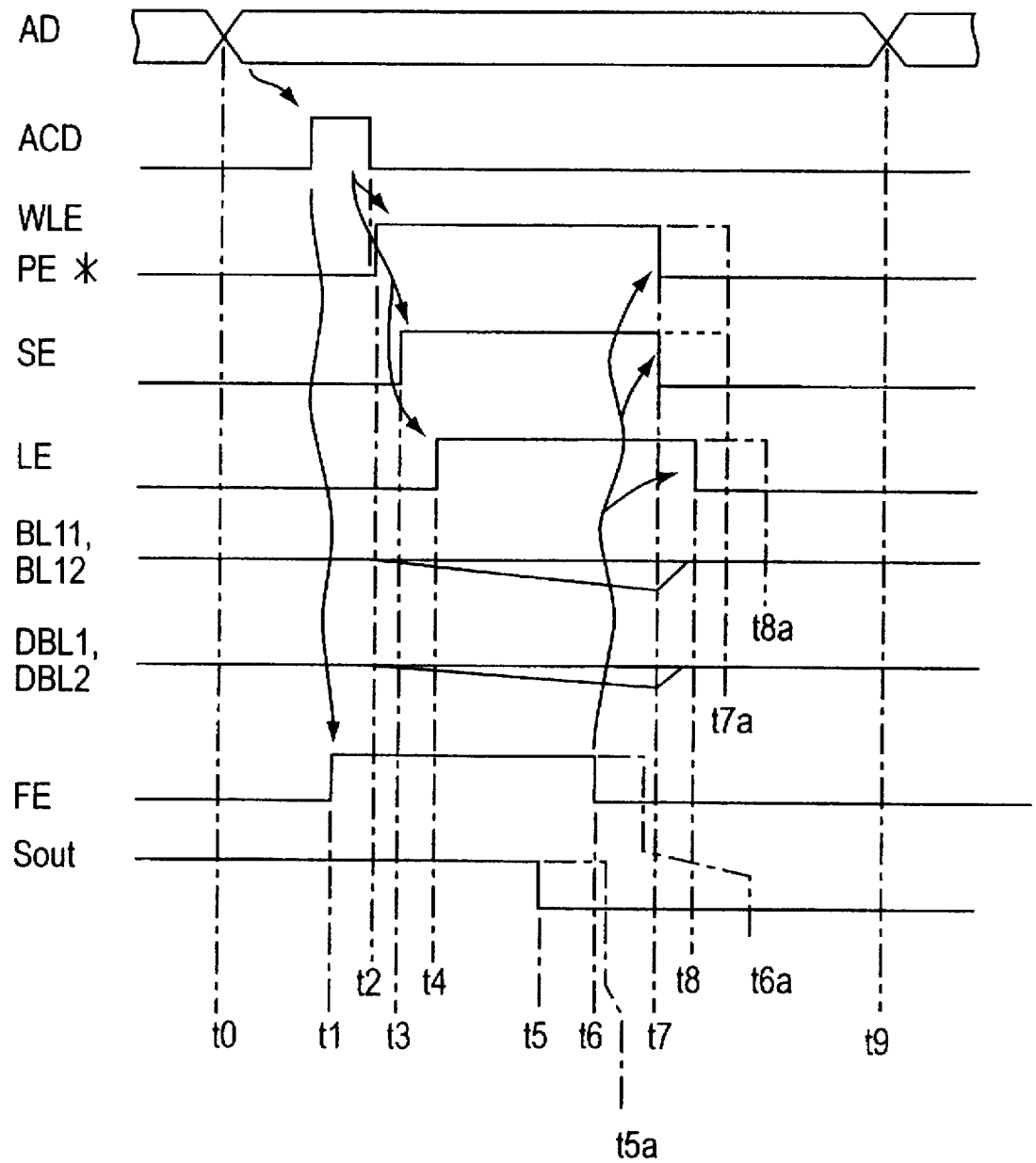
FIG. 9 is a timing wave form chart of the signals of each section illustrating the operation of the embodiment shown in FIG. 6.

The operation of the present embodiment will next be explained with reference to the wave form chart of FIG. 9 showing the timing of signals of each section.

Address transition detection circuit 10 detects address change in address signal AD (t0), generates address transition detection signal ACD, and supplies this signal to internal control signal generation circuit 11.

Internal control signal generation circuit 11 receives address transition detection signal ACD, and both transfers this signal to the input terminal of delay circuit 12 through inverter IV10 and transistor T1 and precharges the output terminal (output signal FE) of dummy amplification circuit 9 to the power-supply potential Vcc level (equal to the precharge potential of dummy bit line) through inverter IV10 and transistor T2 (t1).

Delay circuit 12 delays the transferred signal by a prescribed time interval and supplies the result to a logic circuit made up of, for example, NAND gate NAG1. Address transition detection signal ACD is inputted to this logic circuit by way of inverter IV1. As a result, this logic circuit outputs: word line enable signal WLE which becomes the active level (high level) at time t2, sense amplification enable signal SE which becomes the active level (high level) at time t3, data latch signal LE which becomes the active level (high level) at time t4, and precharge control signal PE* which becomes the inactive level (high level) at time t1.

Row address decoder 2 places one of the plurality of word lines WL1 to WLm at the selected level in accordance with row address signal ADX (A0–Ai) during the interval of the active level of word line enable signal WLE. On the other hand, precharge circuit 3 halts the precharging (the precharge potential is power-supply potential Vcc) of bit line pairs and the dummy bit line pair in response to the inactive level of precharge control signal PE*.

In this way, one word line of selected level and the connected memory cell and dummy memory cell enter a selected state, and the data stored in this memory cell and dummy memory cell are read out to the corresponding bit line pair and dummy bit line pair. The data read out to the bit line pair are selected by column address decoder 4 and column switch circuit 5 and inputted to amplification circuit 6 by way of data lines DL1 and DL2, and the data read out to the dummy bit line are inputted directly to dummy amplification circuit 9.

Amplification circuit 6 amplifies the inputted data and outputs the result to output data latch circuit 7 (Sout), the output data latch circuit 7 latches the data during the time of active level of data latch signal LE and outputs to the outside by way of output buffer circuit 8. Dummy amplification circuit 9 also amplifies the inputted data, but because the data inputted to this dummy amplification circuit 9 are delayed from the data inputted to amplification circuit 6 by dummy amplification output delay means, the timing (t6) at which the output data FE of dummy amplification circuit 9 changes level is later than the timing (t5) at which the output data Sout of amplification circuit 6 changes level. At dummy amplification circuit 9, this output terminal, i.e., the output data, is precharged in advance to the power-supply potential Vcc level that corresponds to the precharge level of the dummy bit line pair, and the amplified output FE becomes the ground potential level, which differs from this precharge level. Accordingly, output data FE changes from high level to low level at time t6.

Because transfer gate TG1 is in an ON state, internal control signal generation circuit receives the level change to low level of the output data FE of this dummy amplification circuit 9, converts word line enable signal WLE and sense amplification enable signal SE to the low-level inactive level and precharge control signal PE* to the low-level active level at timing t7, and converts data latch signal LE to the low-level inactive level at timing t8.

Here, although discrepancies or increases in the interline parasitic capacity of bit lines and dummy bit lines due to irregularities during manufacture may give rise to delays in the operation speed of the memory cells (MC11, etc.), amplification circuit 6 or other components, or delays in the timing of level change of output data Sout of amplification circuit 6 (dotted line and t5a in FIG. 9), the timing of the level change of output data FE of dummy amplification circuit 9 that follows the level change of this output data Sout is similarly delayed (dotted line and t7a in FIG. 9), and consequently, the timing of level change to the inactive level of data latch signal LE and sense amplification enable signal SE, etc., which change to the inactive level upon receiving the low-level level change of this output data FE, is also delayed (dotted line and t7a, t8a in FIG. 9), and therefore, amplification circuit 6 can output correct data, and output data latch circuit 7 can reliably latch correct data from amplification circuit 6 and output to the outside.

Figure 10A:
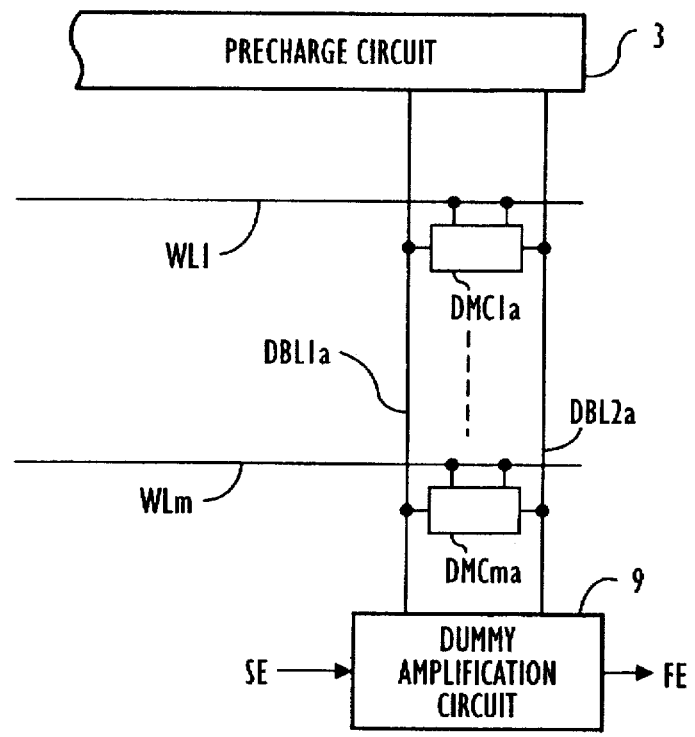
FIG. 10(a) is a block diagram showing the principal portions of the second embodiment of the present invention.
Figure 10B:
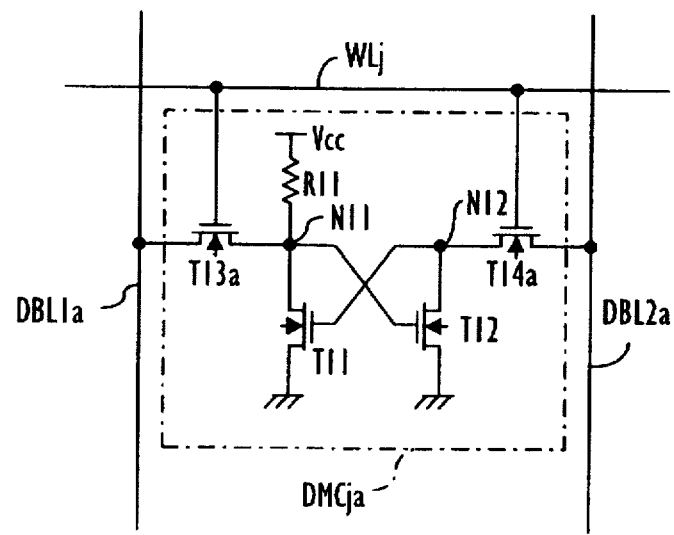
FIG. 10(b) is a circuit diagram showing the dummy memory cell of the embodiment.

FIG. 10(a) is a block diagram showing the principal portions of the second embodiment of the present invention, and FIG. 10(b) is a circuit diagram showing a dummy memory cell.

The second embodiment differs from the first embodiment in that: the line width and line spacing of first and second dummy bit lines DBL1a and DBL2a of the dummy bit line pair are the same as the line width and line spacing of first and second bit lines (BL11, BL12, etc.) of bit line pairs; and dummy memory cell DMCja (j=1-m) and dummy amplification output delay means are constructed in the same way as the memory section of dummy memory cell DMCj, being circuits provided with a dummy memory section having first and second memory nodes N11 and N12 that stores prescribed fixed data, and third and fourth switching transistors T13a and T14a which have a smaller current drive capacity than first and second switching transistors T23 and T24 of memory cell MCjk, which turn ON when the word line connected to a respective gate is the selected level, and which connect first and second memory nodes N11 and N12 of the dummy memory section to first and second dummy bit lines DBL1a and DBL2a, respectively.

In other words, in this embodiment, parasitic capacity between bit lines and parasitic capacity between dummy bit lines are made equal, and transistors T13a and T14a for switching in dummy memory cell DMCja are made smaller than transistors T23 and T24 for switching in memory cell (MCjk), thereby slowing the read-out of stored data of dummy memory cell DMCja to dummy bit line DBL1a and DBL2a, and as a result, the input timing of this read data to dummy amplification circuit 9 and the timing of the level change to low level of the output data FE of dummy amplification circuit 9 are made later than the input timing of read-out memory cell data to amplification circuit 6 and the timing of level change of output data Sout of amplification circuit 6, respectively.

The basic operation and effect of this embodiment are otherwise the same as the first embodiment, and further explanation is therefore omitted.

As explained hereinabove, the present invention is constructed such that the timing of level change of a word line enable signal, a sense amplification enable signal, and a data latch signal to the active level, as well as the timing of level change of a precharge control signal to the inactive level are determined by an address transition detection signal; the timing of level change of the word line enable signal, the sense amplification enable signal, and the data latch signal to the inactive level, as well as the timing of level change of the precharge control signal to active level are determined by the level change of amplification output of the read data of a dummy memory cell that changes level later than the timing of level change of amplification output of read data of an ordinary memory cell, and as a result, despite increases in capacity (parasitic capacity) between bit lines accompanying the trend toward large capacity, variation in this capacity between bit lines due to discrepancies in manufacture, or variation in the operation time of circuits including memory cells and amplification circuits, not only can correct data be outputted from an amplification circuit, but this correct data can be reliably latched in an output data latch circuit and outputted to the outside.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor memory device comprising:
   a memory cell array having first and second data input/output terminals
   and a plurality of memory cells arranged in a row direction and column direction in which, during a selected state, data in a mutually complementary level relation are written from the first and second data input/output terminals and stored, and stored data are read out;
   a plurality of word lines provided corresponding to each row of said plurality of memory cells which, when at a selected level, place a corresponding row of memory cells in a selected state;
   a plurality of bit line pairs provided corresponding to each column of said plurality of memory cells made up of first bit lines that connect first data input/output terminals and second bit lines that connect second data input/output terminals of corresponding columns of memory cells;
   a row address decoder that places at a selected level a prescribed word line among said plurality of word lines in accordance with row address signals when a word line enable signal is at an active level;
   a plurality of dummy memory cells provided at the end of each of said plurality of word lines most remote from said row address decoder, which have first and second data output terminals, which store data that are of fixed levels and in a mutually complementary level relation and, when in a selected state, which read these data from said first and second data output terminals;

a dummy bit line pair made up of a first dummy bit line that connects to first data output terminals and a second dummy bit line that connects to second data output terminals of said plurality of dummy memory cells;

a precharge circuit that precharges said plurality of bit line pairs and dummy bit line pair to a prescribed potential in response to an active level of a precharge control signal;

a column selection circuit that selects a prescribed bit line pair among said plurality of bit line pairs in accordance with a column address signal;

an amplification circuit that amplifies and outputs data of a bit line pair selected by said column selection circuit in response to an active level of a sense amplification enable signal;

an output data latch circuit that latches and outputs output data of said amplification circuit in response to an active level of a data latch signal;

a dummy amplification circuit that amplifies data of said dummy bit line pair in response to an active level of said sense amplification enable signal, and outputs the result as data of a level differing from the precharge potential of said dummy bit line pair;

dummy amplification output precharge means that, before said sense amplification enable signal changes to an active level, precharges the level of the output terminal of said dummy amplification circuit to a level corresponding to the precharge potential of said dummy bit line pair;

dummy amplification output delay means that delays data output timing of said dummy amplification circuit a prescribed, time interval from data output timing of said amplification circuit;

an address transition, detection circuit that detects change in an address value of an address signal including said row address signal and column address signal and outputs an address transition detection signal;

an internal control signal generation circuit that determines timing of level change to an active level of said word line enable signal, sense amplification enable signal, and data latch signal as well as timing of level change to an inactive level of said precharge control signal in response to said address transition detection signal, determines timing of level change to an inactive level of said word line enable signal, sense amplification enable signal, and data latch signal as well as timing of level change to an active level of said precharge control signal in response to timing of level change of output data of said dummy amplification circuit, and outputs said word line enable signal, sense amplification enable signal, data latch signal, and precharge control signal.

2. A semiconductor memory device according to claim 1 wherein said internal control signal generation circuit comprises:

a transistor that transfers address transition detection signals;

a transfer gate that transfers output data of said dummy amplification circuit when said sense amplification enable signal is at an active level;

a delay circuit that delays by prescribed delay times each of the leading edge and trailing edge of a signal transferred by said transistor and transfer gate; and a logic circuit that generates the word line enable signal, the data latch signal, and the precharge control signal in addition to said sense amplification enable signal from output signals of said delay circuit and said address transition detection signal.

3. A semiconductor memory device according to claim 1 wherein said dummy amplification output precharge means is a circuit provided with a transistor that places the output terminal of said dummy amplification circuit at a level corresponding to the precharge potential of said dummy bit line pair in accordance with an address transition detection signal.

4. A semiconductor memory device according to claim 1 wherein said dummy amplification delay means is constructed such that spacing between said first and second dummy bit lines of said dummy bit line pair is narrower than spacing between said first and second bit lines of said bit line pairs, line width of said dummy bit lines is wider than line width of said bit lines, and parasitic capacity between lines of said dummy bit lines is greater than parasitic capacity between lines of said bit lines.

5. A semiconductor memory device according to claim 1 wherein line width and line spacing of said first and second dummy bit lines of said dummy bit line pair is equal to line width and line spacing, respectively, of said first and second bit lines of said bit line pairs;

said memory cells are circuits provided with memory sections having first and second memory nodes, and first and second switching transistors that turn ON when a word line connected to a respective gate is a selected level, and that connect said first memory nodes to said first bit lines and said second memory nodes to said second bit lines; and said dummy memory cells and dummy amplification output delay means are circuits provided with dummy memory sections that have first and second memory nodes and that store prescribed fixed data, and third and fourth switching transistors having current drive capacity smaller than that of said first and second switching transistors, which turn ON when a word line connected to a respective gate is a selected level, and which connect said first memory nodes of said dummy memory section to said first dummy bit line and said second memory nodes of said dummy memory section to said second dummy bit line.

* * * * *